United States Patent

Meny et al.

[11] Patent Number: 5,170,326
[45] Date of Patent: Dec. 8, 1992

[54] ELECTRONIC MODULE ASSEMBLY

[75] Inventors: Keith A. Meny, Wheeling; Patrick A. McGovern, Carol Stream, both of Ill.; David Cottingham, Austin, Tex.; Frank E. Kazak, Algonquin, Ill.

[73] Assignee: Motorola, Inc., Schaumburg, Ill.

[21] Appl. No.: 801,139

[22] Filed: Dec. 2, 1991

Related U.S. Application Data

[63] Continuation-in-part of Ser. No. 474,873, Feb. 5, 1990, Pat. No. 5,103,375.

[51] Int. Cl.[5] .............................................. H05K 7/20
[52] U.S. Cl. ..................................... 361/395; 174/254; 361/398; 361/386; 439/76
[58] Field of Search ............... 165/80.3, 185; 29/829, 29/832, 846; 439/67, 76, 77, 485, 487; 174/35 R, 252, 254; 357/81; 361/383–388, 395, 398, 399, 412, 413, 415, 424

[56] References Cited

U.S. PATENT DOCUMENTS

| 3,676,748 | 7/1972 | Kassabgi | 361/398 |
| 3,766,439 | 10/1973 | Isaacson | 174/254 |
| 3,816,911 | 6/1974 | Knuppenberger | 29/626 |
| 4,495,546 | 1/1985 | Nakamura | 361/398 |
| 4,528,748 | 7/1985 | Eichelberger | 29/835 |
| 4,703,984 | 11/1987 | Mitchell, Jr. | 361/398 |
| 4,792,879 | 12/1988 | Bauknecht | 361/398 |
| 4,811,165 | 3/1989 | Currier | 361/398 |
| 4,858,073 | 8/1989 | Gregory | 174/254 |
| 4,922,059 | 5/1990 | Walker | 174/254 |
| 4,958,260 | 9/1990 | Kobayashi | 361/398 |
| 4,987,442 | 1/1991 | Uemori | 361/398 |
| 5,103,375 | 4/1992 | Cottingham | 361/386 |

FOREIGN PATENT DOCUMENTS 2537925  3/1977  Fed. Rep. of Germany ...... 361/398

Primary Examiner—Gerald P. Tolin
Attorney, Agent, or Firm—John H. Moore

[57] ABSTRACT

An electronic module assembly (50) has a bendable base plate (52) upon which circuit components (76) are mounted. A module enclosure device (56) mates with the base plate and has an integrally formed, non-removable support arm (96). During assembly, the base plate (52) is bent around the support arm (96) in a "C" shape. Thus formed, the base plate (52) and the module enclosure device (56) form an internal cavity that holds the circuit components (76).

12 Claims, 3 Drawing Sheets

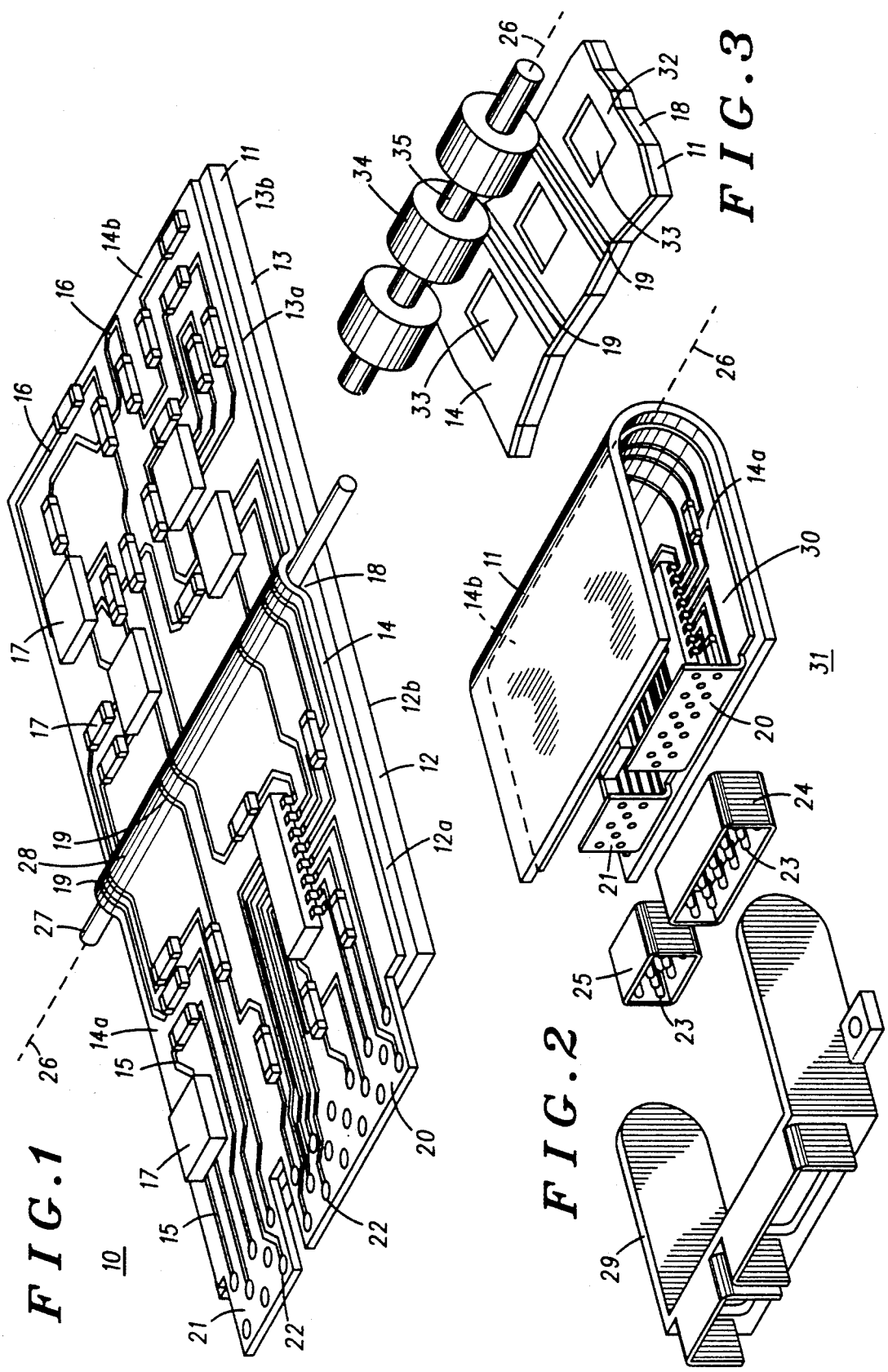

ELECTRONIC MODULE ASSEMBLY

CROSS REFERENCE TO RELATED APPLICATION

This application is a continuation-in-part of U.S. application serial no. 07/474,873, filed Feb. 5, 1990 (referred to herein as the parent application).

FIELD OF THE INVENTION

The present invention relates to electronic module assemblies. More particularly, the present invention is directed to providing an electronic module having an external housing for protecting components located within the module housing.

BACKGROUND OF THE INVENTION

Prior electronic module assemblies are known in which a polyimide flex circuit undergoes planar assembly in which a plurality of components are mounted on conductive circuit patterns on a polyimide film. A plurality of rigidizers plates are provided under various portions of the flex circuit film, and after component assembly the rigidizer plates are oriented so they are non-coplanar. Then the rigidizer plates are mounted to an external protective housing for the module. This prior art module assembly and method requires the additional manufacturing step of mounting the rigidizer plates to the external protective housing. This mounting step may degrade the thermal conduction between the rigidizer plate and the external housing wherein this thermal conduction may be relied upon for providing heat sinking for the components in the assembly which are mounted on the flex circuit film. Also, the providing of the external housing typically represents a significant cost of the module.

BRIEF DESCRIPTION OF THE DRAWINGS

The present invention can be better understood by reference to the drawings in which:

FIG. 1 is a perspective view of a planar flex circuit subassembly as described in the parent U.S. application;

FIG. 2 is an exploded perspective view of an electronic module assembly which utilizes the flex circuit subassembly shown in FIG. 1 after that assembly is bent into a desired shape;

FIG. 3 is a partial perspective view of a flex circuit subassembly similar to that shown in FIG. 1 for which an alternative bending step is contemplated;

DESCRIPTION OF THE PREFERRED EMBODIMENT

Figure 4:
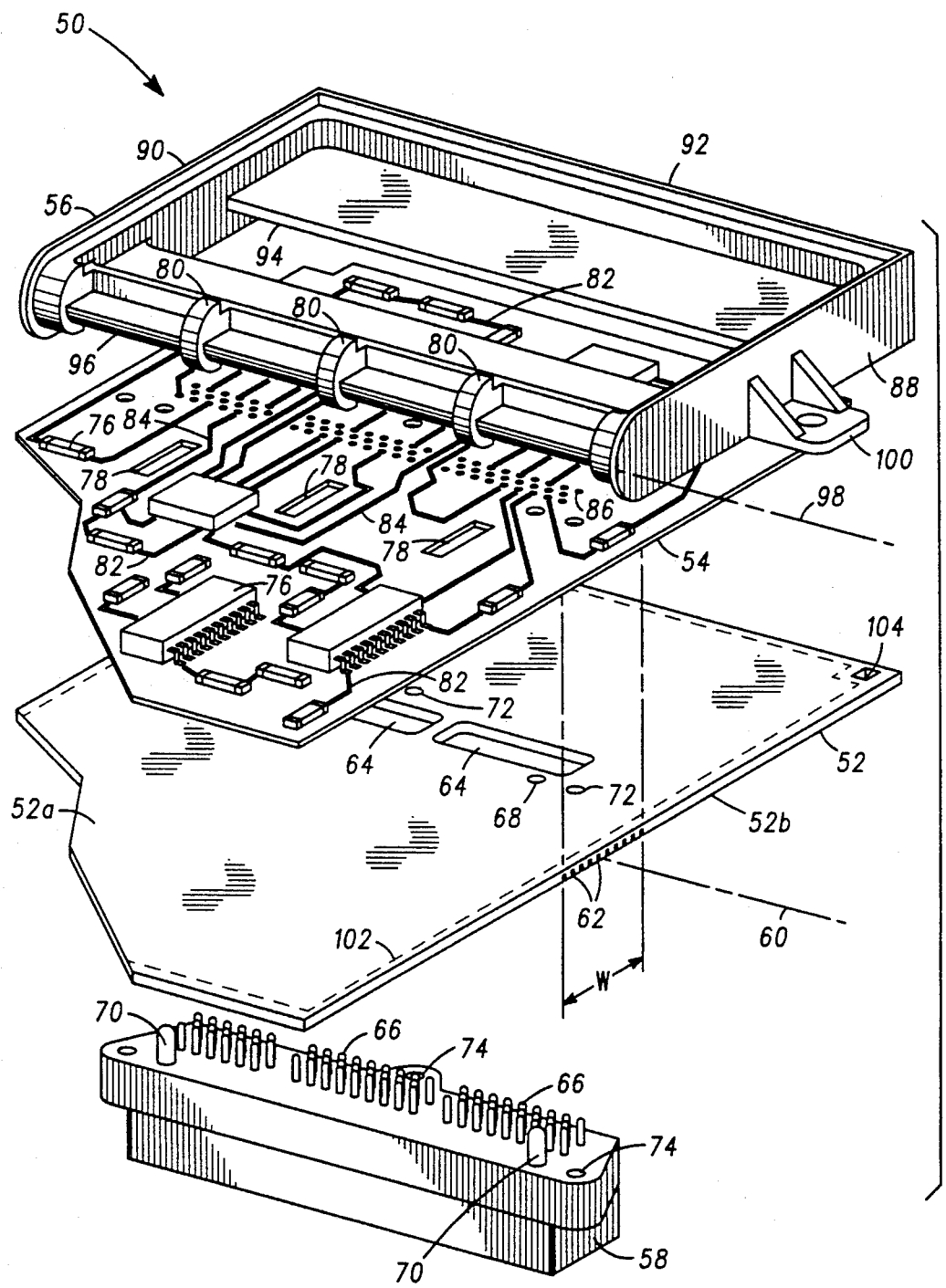
FIG. 4 is an exploded perspective view of an electronic module assembly constructed according to the present invention, some of the components being shown in a planar form prior to being bent into their final shapes.

Referring to FIG. 1, a planar flex circuit subassembly 10, as disclosed in the parent U.S. application, is illustrated prior to a bending operation. The subassembly 10 comprises a rigid thermally conductive planar aluminum base plate 11 having integral first and second portions 12 and 13 each having its own planar top and bottom surfaces 12a, 12b, 13a and 13b, respectively. A preformed sheet of polyimide insulating film 14 is bonded to the first and second base portion top surfaces 12a and 13a. Preferably, prior to any bending of the base 11, first and second electrically conductive circuit patterns (traces/metalizations) 15 and 16 are provided on portions 14a and 14b of the polyimide film which are bonded to the top surfaces 12a and 13a, respectively. A plurality of discrete electrical components 17 are provide on and connected to each of the first and second circuitry patterns 15 and 16.

The aluminum rigidizer base plate 11 has an integral intermediate portion 18 between the first and second portions 12 and 13, and circuit paths (metalizations) 19 on the flex circuit film 14 interconnect the first and second circuitry patterns 15 and 16 and the components 17 located on each of the top surfaces 12a and 13a. The flex circuit film 14 has a pair of nonbonded and nonsupported integral extending portions 20 and 21 each having a plurality of holes 22 therein adjacent conductive metalizations. These holes are intended for subsequent mating connection to electrical contact pins 23 of a pair external electrical connectors 24 and 25 shown in FIG. 2. These connections are to be made by conventional soldering techniques, as are the connections between the components 17 and the conductive circuit patterns 15 and 16. The components 17 are soldered to the circuit patterns 15 and 16 by reflow solder techniques while the surfaces 12a, 13a, 14a, and 14b are essentially coplanar. Each of the connectors 24 and 25 has its own associated rigid plastic housing. If possible only a signal connector might be usable.

The structure which has so far been described above is conventional. However, due to final packaging form requirements it may sometimes be desired to have the rigidizer plate portions 12 and 13 oriented in a final non-coplanar configuration. In such a case, previously these rigidizer portions would typically be provided as separate nonintegral plates or planar integral plates connected by removeable or breakable runners to facilitate reorienting the plates in a subsequent non-coplanar configuration. These plates would then also be mechanically, and possibly thermally, bonded to an external module housing which would provide mechanical protection for the components 17. However, the invention disclosed in the parent application, as well as the present invention, contemplate alternative structures and manufacturing methods to achieve these alternative structures.

Referring to FIG. 1, an axis 26 is illustrated about which the integral rigidizer plate 11 will be bent by a sheet metal bending process after the components 17 have been soldered to the conductive circuit patterns 15 and 16. The axis 26 is shown in FIG. 1 to be substantially coincidental with the axis of a mandrel shaft 27 positioned on the top surface of the plate 11 and beneath a nonbonded loop portion 28 of the flex film 14. The interconnecting circuit paths 19 are provided on this loop portion 28 which is oriented generally along the axis 26. It is contemplated that the mandrel shaft 27 is utilized during the bending of the rigidizer plate 11 into a final desired C shape configuration as shown in FIG. 2. The nonbonded loop portion 28 of the flex film 14 provides an intermediate integral film portion that connects film portions 14a and 14b on which the conductive circuit patterns 15 and 16 are provided on, respectively. Prior to or after the desired bending step, the electrical pins 23 of the connectors 24 and 25 are joined to the circuit patterns adjacent the through holes 22 in the extending flex tabs 20 and 21. After the bending step an additional module enclosure assembly portion 29, which may comprise a plastic molded component, is mated to and joined to the bent rigidizer base plate 11 and the connectors 24 and 25. This substantially encloses an interior space 30 effectively bounded by the top surfaces 12a and 13a of the bent rigidizer plate, the connectors 24 and 25 and the enclosure portion 29. Note that some details of the components 17 and metalizations within the space 30 are not shown in FIG. 2.

After the bending operation, the first and second rigidizer plate top surfaces 12a and 13a are non-coplanar and the bottom surfaces 12b and 13b now form the external surface of a protective housing for the components 17 which are located in the interior space 30. The connectors 24 and 25 and the enclosing portion 29 form the rest of the protective housing for the components 17. Assembly of the module components shown in FIG. 2 results in an electronic module assembly 31 which requires no additional external protective housing since the bent rigidizer plate 11, the enclosing portion 29 and the electrical connectors 24 and 25 provide the desired protective housing. The connectors provide external electrical access to the components 17. In addition, there is no required thermal connection of the rigidizer plate 11 to an external housing for heat sinking unless additional heat sinking capacity, in addition to than that provided by the rigidizer plate 11, is required. The plate 11 already provides some heat sinking since it has a significant thermal mass.

Preferably, the electronic module assembly 31 can be implemented while providing a hermetic seal for the interior space 30. The plastic enclosing portion 29 could have plastic posts which were ultrasonically deformed over the rigidizer plate 11 to provide the desired final assembly. Alternatively, epoxy or some other adhesive could be utilized to form a hermetic seal and/or bond the enclosing portion 29 and connectors 24 and 25 to the bent rigidizer plate 11.

The providing of the loop portion 28 of the flex circuit is significant in that it permits minimizing stress applied to the flex circuit adjacent the bending axis 26 during the bending operation. The presence of loop 28 takes up stress which might be applied to the interconnects 19 during any bending of the base 11 and also allows the mandrel shaft to directly contact the base 11 during bending without applying pressure through the film 14 which might rupture or scratch the interconnects 19. Such a feature is useable whenever it is desired to bond a flex circuit portion to a planar rigidizer plate, planarly assemble components thereon, preferably by conventional reflow soldering techniques, and then subsequently bend the rigidizer plate into a desired shape. This technique is particularly useful when the flex circuit comprises a preformed sheet of insulating material, such as film 14, having conductive metalization patterns thereon prior to the bending of the rigidizer plate.

FIG. 3 illustrates an alternate technique for accomplishing a desired bending of the rigidizer plate 11. In FIG. 3, only a central portion of the rigidizer plate 11 and the flex circuit film 14 bonded thereto is illustrated. In FIG. 3, a central portion 32 of the flex circuit film 14 is provided on intermediate portion 18 with a plurality of openings 33 therein generally along the bend axis 26. The openings 33 mate with a plurality of raised portions 34 of a mandrel 35 shown in FIG. 3. The interconnecting circuit paths 19 are provided on the central film portion 32 between the openings 33. During the bending process as contemplated by the structure shown in FIG. 3, the raised portions 34 of the mandrel 35 will directly contact the top surface of the rigidizer plate 11 through the openings 33, but portions of the mandrel between the raised portions 34 will not contact or press against the interconnecting circuit paths 19 during the bending process. This prevents the mandrel from scratching or otherwise disrupting the circuit patterns 19 or the film 14 during the bending process while still allowing the mandrel to provide force against the rigidizer plate 11 during the bending process. This technique could be used if the film 14 were first deposited on the base 11, the metalizations 15, 16 and 19 were then applied to the film, and then the base 11 were bent.

FIG. 3 shows how to use a mandrel having raised portions 34 in conjunction with holes 33 in the film 14. However, it is also possible to obtain suitable results without providing the holes 33, as long as the interconnections 19 are positioned, as shown in FIG. 3, between the raised portions 34 during the bending process.

Referring now to FIG. 4, the illustrated electronic module assembly 50 is shown as including a base plate 52, a polyimide insulating film 54, a module enclosure means 56, and a connector 58.

Figure 5:
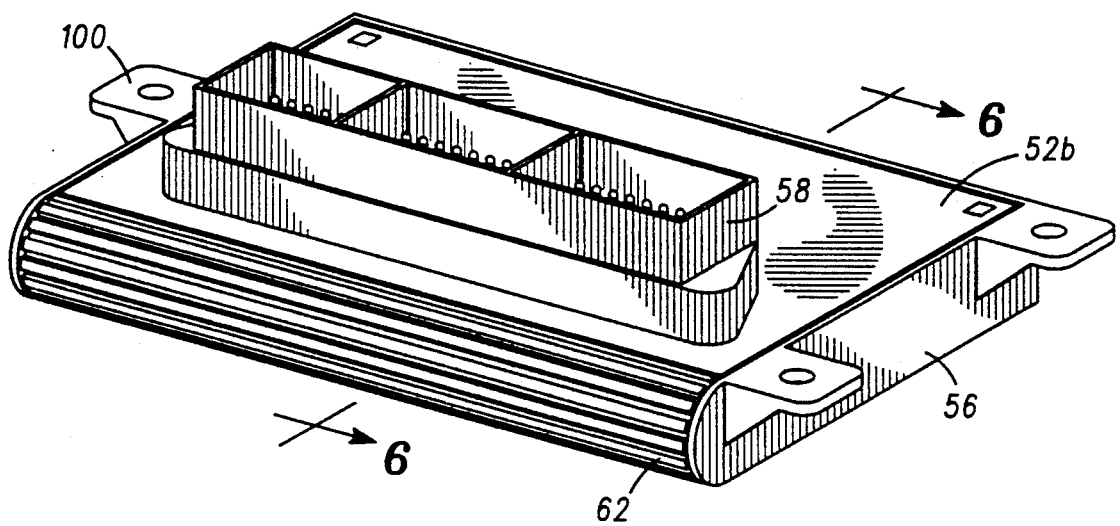
FIG. 5 is a perspective view of the assembly of FIG. 4 after having been bent and assembled into its final configuration.

The base plate 52 has an inner surface 52a, an outer surface 52b (shown best in FIGS. 5 and 6), and is preferably made of aluminum with a typical thickness of about 90 mils. This base plate will ultimately be bent about its bend axis 60 into a "C" shape and, to facilitate the bending process, the thickness of the base plate 60 is reduced in areas adjacent to the bend axis 60. In the illustrated embodiment, this reduction in thickness is effected by forming grooves 62 in the outer surface 52b of the base plate 52. These grooves are substantially parallel to the bend axis 60 and extend for the full width of the base plate, as best shown in FIG. 5. In the other direction, the grooves are distributed over a distance W that is substantially centered about the bend axis 60.

The base plate 52 has a number of apertures formed in it. Apertures 64 receive pins 66 in the connector 58 when the assembly is completed. Apertures 68 receive locating pins 70 formed on the connector 58, and apertures 72 align with mating apertures 74 in the connector to receiving fasteners which hold the connector to the base plate 52.

Circuit components 76 are carried above the inner surface 52a of the base plate 52 by the insulating film 54. Preferably, most portions of the insulating film 54 are adhesively bonded to the upper surface of the base plate, except that a non-bonded portion is formed where the insulating film overlies the bend axis 60. In the illustrated embodiment, the portion of the insulating film that is not bonded to the base plate 52 extends completely across the width of the film in a direction parallel to the bend axis 60, and extends in the other direction for the full span of the dimension W.

In the non-bonded portion of the insulating film 54, three openings 78 are formed. These openings 78 are aligned to receive raised portions 80 on the module enclosure means 56. The function of the openings 78 is discussed in more detail below.

The insulating film 54 also carries conductive circuit patterns 82 that are situated at least on those portions of the film 54 that are bonded to the base plate 52, the function of which is to electrically interconnect electrical components. Additionally, interconnecting circuit paths 84 are formed on the insulating film between the openings 78 so as to interconnect the circuit patterns 82 that are situated on opposite sides of the non-bonded portion of the insulating film.

Connecting holes 86 are also formed in the insulating film 54 for the purpose of receiving the pins 66 carried by the connector 58. When the illustrated components are fully assembled, the connector pins 66 extend through the apertures 64 in the base plate and are received by the holes 86 which are electrically coupled to at least some of the conductive circuit patterns on the insulating film.

Turning now to the module enclosure means 56, it includes a pair of arms 88 and 90 that are joined at one end by a laterally extending arm 92. A stiffening plate 94 may extend between the arms 88 and 90 as shown.

A support arm 96 extends between the arms 90 and 88 and is formed as an integral, non-removable part of the module enclosure means. This support arm acts as a mandrel around which the base plate 52 is ultimately bent to form its final shape.

The support arm 96 has an axis 98 that is substantially parallel to the bend axis 60 of the base plate 52. Along this axis 98, the support arm 96 has a plurality (three in this embodiment) of raised portions 80 which contact the inner surface 52a of base plate 52 during the bending process to be described.

Each of the arms 88, 90 may carry a mounting foot 100 which may be used to mount the entire assembly on another structure.

The assembly process for the illustrated components is as follows. With the base plate in its flat (non-bent) configuration, the insulating film is bonded to the base plate, except at the non-bonded portion discussed above. The insulating film will already have the circuit patterns 82 and interconnecting circuit paths formed on it.

Next, solder paste is applied to the insulating film, and the connector 58 is attached to the base plate 52 such that the pins 66 of the connector mate with corresponding holes 86 in the insulating film.

The circuit components 76 may then be mounted on the insulating film. A solder reflow process is then used to complete all circuit and connector pin electrical connections.

A wet seal material is then applied along the periphery of the base plate's upper surface 52a. The portion of the base plate that receives the wet seal material is located between a dashed line 102 and the outer edge of the base plate.

The module enclosure 56 is now mated with the base plate 52 such that the bottom surfaces of arms 88, 90 and 92 contact the wet seal material previously applied to the base plate's upper surface 52a. (The insulating film 54 is slightly smaller than the base plate 52 so that it does not overlie the peripheral area of the base plate that receives the wet seal material.) Alignment holes, such as hole 104, may be formed in the base plate to receive mating alignment pins (not shown) carried by the module enclosure means 56.

With the illustrated components assembled as described above, the raised portions 80 on the support arm 96 extend through the openings 78 in the insulating film to contact the upper surface 52a of the base plate. In this condition, the assembly is ready to be formed into its final shape by bending the base plate 52 over the support arm 96 which now acts as a mandrel. Actual contact between support arm 96 and the base plate 52 is limited to that physical contact which occurs between the upper surface 52a of the base plate and the raised portions 80 of the support arm 96.

Figure 6:
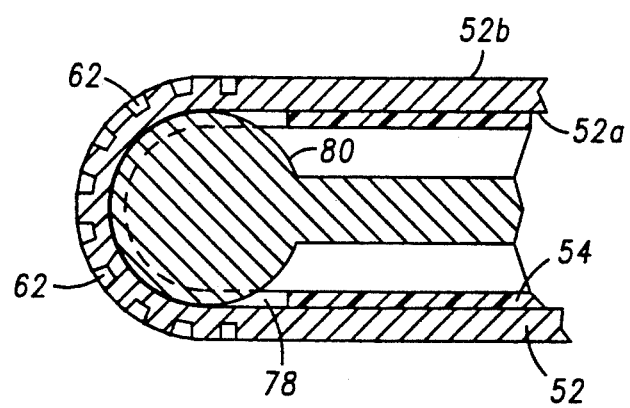
FIG. 6 is a sectional view of the electronic module assembly as viewed along lines 6-6 in FIG. 5.

The bending continues until the base plate is formed into a C shape as shown in FIGS. 5 and 6. In this completed configuration, the module enclosure means 56 cooperates with the base plate 52 to form an internal cavity that holds the circuit components that are mounted on the insulating film 54.

Referring to FIGS. 5 and 6, it can be seen that the grooves 62 that are formed on the base plate occupy the area of the base plate in which the bending occurs. These grooves make the bending process easier; they also reduce the amount of spring back that would otherwise be associated with the base plate.

If desired, the base plate may be crimped around its periphery to the module enclosure means to form an additional physical attachment between the base plate and the module enclosure means.

With particular reference now to FIG. 6, it can be seen how one of the raised portions 80 is in physical contact with the bent portion of the base plate 52 and that this physical contact occurs through one of the openings 78 in the insulating layer 54. The non-bonded portion of the insulating film 54 also is situated generally in this same area where the C shape bend occurs to facilitate flexing of the insulating film and to minimize any damage to it that could otherwise occur when the bending operation takes place.

There are a number of advantages associated with the construction shown in FIGS. 4 through 6. First, the integral mandrel or support arm 96 tends to strengthen the overall structure of the completed assembly. Further, and perhaps even more importantly, the fact that the support arm 96 is an integral portion of the overall structure and does not need to be removed after the bending operation eliminates any possible damage to the components on the insulating film that could occur during such removal process. It also permits the wet seal material to be applied to the base plate prior to the bending operation, thereby making it somewhat easier to apply the seal material. This embodiment also has the advantages that have been described above with reference to FIGS. 1 through 3.

While we have shown and described specific embodiments of the present invention, further modifications and improvements will occur to those skilled in the art. All such modifications which retain the basic underlying principles disclosed and claimed herein are within the scope of this invention.

We claim:

1. An electronic module assembly, comprising:
    a base plate having a bend axis along which the base plate is bent in a "C" shape to provide an inner surface and an outer surface;
    circuit components carried within the "C" shape of the base plate;
    module enclosure means mating with the base plate so as to form an internal cavity that holds the circuit components, the module enclosure means including an integral support arm which extends across the base plate within the "C" shape and substantially parallel to the bend axis to provide a mandrel around which the base plate is bent.

2. An electronic module assembly as set forth in claim 1 wherein the base plate has a thickness that is reduced in areas adjacent to the bend axis.

3. An electronic module assembly as set forth in claim 2 wherein the base plate has grooves formed in its surface in said areas adjacent to the bend axis, and wherein the grooves are substantially parallel to the bend axis.

4. An electronic module assembly as set forth in claim 1, further including an insulating film on the inner surface of the base plate, most of the insulating film being bonded to the base plate while leaving a non-bonded portion of the insulating film where the insulating film overlies the bend axis.

5. An electronic module assembly as set forth in claim 1, further including an insulating film on most of the inner surface of the base plate, wherein the insulating film carries the circuit components and conductive circuit patterns on opposite sides of the bend axis, wherein the insulating film has openings situated along the bend axis, and further including interconnecting circuit paths formed on the insulating film and situated between the openings so as to interconnect conductive circuit patterns on one side of the bend axis with conductive circuit patterns on the opposite side of the bend axis.

6. An electronic module assembly as set forth in claim 1 wherein the integral support arm has an axis that is substantially parallel to the bend axis( and wherein the integral support arm has a plurality of raised portions situated along its axis such that the raised portions contact the inner surface of the base plate.

7. An electronic module assembly as set forth in claim 6, further including an insulating film on the inner surface of the base plate and that carries the circuit components, and wherein the insulating film has openings therein that receive the raised portions of the support arm and permit such raised portions to contact the inner surface of the base plate.

8. An electronic module assembly as set forth in claim 1, further including:
an electrical connector having connector pins and being mounted to the outer surface of the base plate; and
an insulating film mounted on the inner surface of the base plate and carrying conductive circuit patterns, the connector pins being electrically coupled to at least some of the conductive circuit patterns.

9. An electronic module assembly, comprising:
a base plate having a bend axis along which the base plate is bent in a "C" shape to provide an inner surface and an outer surface, the base plate having a thickness that is reduced in areas adjacent to the bend axis;
an insulating film on the inner surface of the base plate, carrying conductive circuit patterns, and having openings situated along the bend axis;
circuit components mounted on the insulating film and electrically couped to the conductive circuit patterns;
module enclosure means mating with the base plate and forming an internal cavity that holds the circuit components, the module enclosure means including an internal support arm having an axis that is substantially parallel to the bend axis and having a plurality of raised portions situated along its axis so that the raised portions are aligned with and received by the openings in the insulating film, the raised portions thereby contacting the inner surface of the base plate.

10. An electronic module assembly, comprising:
a base plate having a bend axis along which the base plate is bent in a "C" shape to provide an inner surface and an outer surface;
an insulating film on the inner surface of the base plate, most portions of the insulating film being bonded to the base plate while leaving a non-bonded portion of the insulating film where the insulating film overlies the bend axis, the insulating film having openings in the non-bonded portion, having conductive circuit patterns situated at least in the bonded portions, and having interconnecting circuit paths formed on the insulating film between the openings so as to interconnect conductive circuit patterns situated on the bonded portions of the insulating film;
circuit components mounted on the insulating film and electrically coupled to the conductive circuit patterns; and
module enclosure means mating with the base plate and forming an internal cavity that holds the circuit components, the module enclosure means including an integral support arm which contacts the inner surface of the base plate through the openings in the insulating film.

11. An electronic module assembly as set forth in claim 10 wherein the base plate has a thickness that is reduced in areas of the base plate adjacent the bend axis.

12. An electronic module assembly as set forth in claim 11, further including an electrical connector having connector pins and being mounted to the outer surface of the base plate, the connector pins being electrically coupled to at least some of the conductive circuit patterns on the insulating film.

* * * * *